(12) United States Patent
Vais

(10) Patent No.: US 11,658,210 B2
(45) Date of Patent: May 23, 2023

(54) LOW PARASITIC $C_{cb}$ HETEROJUNCTION BIPOLAR TRANSISTOR

(71) Applicant: IMEC VZW, Leuven (BE)

(72) Inventor: Abhitosh Vais, Heverlee (BE)

(73) Assignee: Imec VZW, Leuven (BE)

( * ) Notice: Subject to any disclaimer, the term of this patent is extended or adjusted under 35 U.S.C. 154(b) by 0 days.

(21) Appl. No.: 17/369,565

(22) Filed: Jul. 7, 2021

(65) Prior Publication Data
US 2022/0157939 A1     May 19, 2022

(30) Foreign Application Priority Data

Nov. 19, 2020 (EP) ..................................... 20208662

(51) Int. Cl.
    *H01L 29/08*     (2006.01)
    *H01L 29/66*     (2006.01)
    *H01L 29/737*     (2006.01)

(52) U.S. Cl.
CPC .... *H01L 29/0817* (2013.01); *H01L 29/66242* (2013.01); *H01L 29/737* (2013.01)

(58) Field of Classification Search
CPC ........... H01L 29/0817; H01L 29/66242; H01L 29/737
See application file for complete search history.

(56) References Cited

U.S. PATENT DOCUMENTS

| | | | |
|---|---|---|---|
| 4,792,837 A | 12/1988 | Zazzu | |
| 4,889,821 A * | 12/1989 | Selle | H01L 29/66318 257/745 |
| 5,147,775 A | 9/1992 | Ota et al. | |
| 5,341,023 A | 8/1994 | Hsieh et al. | |
| 5,460,982 A | 10/1995 | Bertagnolli et al. | |
| 8,994,975 B2 | 3/2015 | Ono | |
| 10,431,581 B1 | 10/2019 | Li et al. | |
| 2003/0189239 A1 | 10/2003 | Kalnitsky et al. | |

(Continued)

OTHER PUBLICATIONS

Extended European Search Report and Written Opinion, Application No. EP20208662.5, dated May 3, 2021, 11 pages.

(Continued)

*Primary Examiner* — Syed I Gheyas
(74) *Attorney, Agent, or Firm* — McDonnell Boehnen Hulbert & Berghoff LLP

(57) ABSTRACT

The present disclosure provides an HBT that includes (i) a semiconductor support layer; at least four wall structures side-by-side on the support layer; (iii) a semiconductor collector-material ridge structure disposed on the support layer between two adjacent wall structures of the at least four wall structures; (iv) a semiconductor base-material layer, wherein a first part of the base-material layer is disposed on a first region of the ridge structure and a second part of the base-material layer is disposed across the wall structures, wherein the base-material layer is supported by the wall structures; (v) a semiconductor emitter-material layer disposed on the first part of the base-material layer; (vi) a base contact layer disposed on the second part of the base-material layer; an emitter contact layer disposed on the emitter-material layer; and (viii) a collector contact layer disposed on a second region of the ridge structure.

18 Claims, 14 Drawing Sheets

(56) References Cited

U.S. PATENT DOCUMENTS

| | | |
|---|---|---|
| 2005/0023643 A1* | 2/2005 | Li .................. H01L 29/42304 |
| | | 257/E29.189 |
| 2014/0084420 A1 | 3/2014 | Adkisson et al. |
| 2015/0137185 A1 | 5/2015 | Camillo-Castillo et al. |

OTHER PUBLICATIONS

Happich, Julien, "III-V and III-N devices on Si target 100GHz front-end modules", Jan. 10, 2020, 2 pages. Retrieved from https://eenewseurope.com/news/iii-v-and-iii-n-devices-si-target-100ghz-front-end-modules.

* cited by examiner

PRIOR ART

PRIOR ART

LOW PARASITIC $C_{cb}$ HETEROJUNCTION BIPOLAR TRANSISTOR

CROSS-REFERENCE TO RELATED APPLICATIONS

The present application is a non-provisional patent application claiming priority to European Patent Application No. EP 20208662.5, filed Nov. 19, 2020, the contents of which are hereby incorporated by reference.

TECHNICAL FIELD

The present disclosure relates to a Heterojunction Bipolar Transistor (HBT), in particular, to a HBT fabricated using Nano-Ridge Engineering (NRE) technology in semiconductor ridge structures. Embodiments provided in this disclosure provide a HBT and also provide a method for fabricating such a HBT. The HBT according to embodiments provided herein has a very low parasitic base-collector capacitance. Further, due to a specific contacting scheme, the HBT according to embodiments provided herein has very low contact-induced parasitic capacitances.

BACKGROUND

Two of the primary performance metrics for a HBT for Radio Frequency (RF) applications are the cut-off frequencies for maximum current gain ($F_t$) and power gain ($F_{max}$), respectively. As the consumer requirements continue to push higher, parasitic capacitances and resistances are becoming the most critical factors in limiting the HBT performance. In particular, the base-collector (depletion) capacitance ($C_{cb}$) is one critical parasitic capacitance, because it affects both $F_t$ and $F_{max}$.

FIG. 13 illustrates a conventional HBT 130, which comprises a sub-collector region 131, a collector region 132 arranged on the sub-collector region 131, a base region 133 arranged on the collector region 132, and an emitter region 135 arranged on the base region 133. The emitter region 135 is narrower than the base region 133, to provide space to form base contacts 134 for contacting the base region 133 next to the emitter region 135. The emitter region 135, and the parts of the base region 133 and collector region 132 that are located beneath the emitter region 135, together form the active (transistor) area of the HBT 130.

The parasitic $C_{cb}$ is indicated in FIG. 13 and is beneath the base contacts 134. It could be reduced, for instance, by eliminating the part of the collector region 132, which is located underneath the base contacts 134, since this part of the collector region 132 is not part of the active transistor area. However, the challenge in controlling, and in particular reducing, the value of the parasitic $C_{cb}$ for an improved performance of the HBT 130 is twofold.

Firstly, scaling the width of the collector region 132 would also limit the space for the base contacts 134, thereby severely limiting the base resistance ($R_{bb}$), which would again adversely affect $F_{max}$. Secondly, selectively etching out the unwanted parts of the collector region 132 is not only difficult, but also limits the stability of the HBT and thus its fabrication yield, especially, in case of the HBT being a Schottky HBT (SHBT), where this is not a suitable solution in a traditional process flow.

One conventional approach to reduce the parasitic $C_{cb}$ in a HBT is the transferred substrate method. In this method, the HBT is fabricated on a blanket substrate up to the formation of the base contacts 134. Afterwards, the HBT is transferred to a host wafer in an upside-down orientation, and is then bonded to the host wafer. Following the removal of a carrier wafer from the top, the collector region can then be patterned to reduce the parasitic $C_{cb}$. However, this is a very complex process, and thus also not the ideal solution in terms of yield.

Another conventional approach to reduce the parasitic $C_{cb}$ in a HBT is to deliberately over-etch the collector region 132 in a process flow based on blanket wafers. However, this still leads to significant stability and yield issues.

Furthermore, as illustrated in FIG. 14, conventional approaches for fabricating a HBT with a reduced parasitic $C_{cb}$ have the additional problem that contact-induced parasitic capacitances are created, which arise mainly from an overlap of the different contact layers of the HBT, i.e., an overlap between conducting lines fabricated in the front end of line (FEOL) process. In particular, an overlap of the base contact layers, emitter contact layers and collector contact layers leads to the contact-induced parasitic capacitances.

SUMMARY

Embodiments of the present disclosure aim to provide an improved HBT and a method to fabricate such a HBT. An HBT as described herein may have enhanced cut-off frequencies for both maximum current gain and power gain. To this end, the aim is to provide the HBT with reduced parasitic capacitances, including reduced base-collector capacitance (parasitic $C_{cb}$) and reduced contact-induced parasitic capacitances. However, at the same time the stability of the HBT should not be compromised. In addition, a high fabrication yield is of course another important goal for the HBT fabrication.

These benefits can be obtained by the embodiments provided in the enclosed independent claims. Implementations of these embodiments are defined in the dependent claims.

The embodiments described herein provide an HBT that includes a ridge structure in the active area, for instance a nanoridge, to reduce the parasitic $C_{cb}$. The HBT, particularly the ridge structure, may be fabricated using the NRE technology. Further, the embodiments herein provide a cross-contacting scheme for contacting the HBT, according to which the emitter contact layer, base contact layer, and collector contact layer may have a reduced overlap and may be arranged orthogonal to each other to reduce contact-induced parasitic capacitances.

A first aspect of the disclosure provides a HBT comprising: a semiconductor support layer; at least four wall structures arranged on the support layer, wherein the wall structures are arranged side-by-side; a semiconductor collector-material ridge structure arranged on the support layer, wherein the ridge structure is arranged between two adjacent wall structures of the at least four wall structures; a semiconductor base-material layer, wherein a first part of the base-material layer is arranged on a first region of the ridge structure and a second part of the base-material layer is arranged across the wall structures, wherein the base-material layer is supported by the wall structures; a semiconductor emitter-material layer arranged on the first part of the base-material layer; a base contact layer arranged on the second part of the base-material layer; an emitter contact layer arranged on the emitter-material layer; and a collector contact layer arranged on a second region of the ridge structure.

The two adjacent wall structures of the at least four wall structures may, in particular, be the two central wall structures (i.e., the pair of adjacent wall structures arranged in the middle of all possible adjacent pairs of wall structures). The wall structures support the base-material layer and the base contact layer, and thus provide stability to the HBT. The HBT is very stable, although there may be no collector-material below the base-material layer and adjacent to the ridge structure. As a consequence of the missing collector-material between the wall structures that carry the second part of the base-material layer and the base contact layer, the HBT has an extremely low, or even zero $C_{cb}$. Accordingly, the cut-off frequencies for maximum current gain ($F_t$) and power gain ($F_{max}$) are improved.

Furthermore, due to the arrangement of the base contact layer, the emitter contact layer and the collector contact layer as described above, an overlap between the contact layers can be reduced significantly, if not completely eliminated. Thereby, contact-induced parasitic capacitances can be avoided. The contacting scheme is possible due to the second part of the base-material layer being arranged across and being supported by the wall structures, which are arranged next to the ridge structure.

In an implementation of the HBT, the base contact layer, the emitter contact layer, and the collector contact layer are unconnected.

In an implementation of the HBT, the base contact layer, the emitter contact layer, and the collector contact layer are non-overlapping.

This allows to further reduce and minimize, or even to eliminate, the parasitic capacitance induced by the contact layers.

In an implementation of the HBT, the ridge structure and the base-material layer extend perpendicular to each other in a top view of the HBT.

The ridge structure may further extend parallel to the two adjacent wall structures, and may further extend also parallel to the other wall structures. The base-material layer may accordingly be perpendicular also to the wall structures, and may thus be well supported by the wall structures.

In an implementation of the HBT, the base contact layer and at least one of the collector contact layer and the emitter contact layer extend perpendicular to each other in a top view of the HBT.

In this way, an overlap of the contact layers can be reduced or even eliminated.

In an implementation of the HBT, the emitter contact layer is arranged only above the first region of the ridge structure.

In an implementation, the HBT comprises two separate collector material contact layers arranged on the ridge structure; wherein each collector material contact layer extends along the ridge structure; and/or wherein the emitter contact layer is arranged between the two collector material contact layers in a top view of the HBT.

In an implementation of the HBT, the emitter contact layer is arranged above the first region of the ridge structure and additionally extends along the ridge structure.

In an implementation, the HBT comprises two separate base material contact layers arranged on the base-material layer; wherein each base material contact layer extends along the base-material layer; and/or wherein the emitter contact layer is arranged at least partly between the two base material contact layers in a top view of the HBT.

In an implementation of the HBT, spaces between the wall structures other than the two adjacent wall structures confining the ridge structure are filled with air and/or with an insulator material.

Suitable insulator materials may further improve the stability of the HBT, without adding parasitic $C_{cb}$.

In an implementation, the HBT comprises an even number of at least four wall structures; wherein an odd number of at least one wall structure is arranged on either side of the two adjacent wall structures confining the ridge structure.

In an implementation of the HBT, the at least four wall structures are arranged at a regular interval.

In an implementation of the HBT, an active transistor area is formed by the first region of the collector-material ridge structure, the first part of the base-material layer arranged on the first region of the ridge structure, and the emitter-material layer arranged on the first part of the base-material layer.

In an implementation of the HBT, the semiconductor collector-material and the semiconductor emitter-material comprise a first-conductivity-type III-V semiconductor material; and the base-material comprises a second-conductivity-type III-V semiconductor material.

The III-V semiconductor material allows a well-controlled formation, in particular growth, of the ridge structure. The ridge structure may be grown using the NRE technology, wherein the ridge structures may be a nanoridge.

In an implementation of the HBT, the wall structures comprise a silicon oxide; and/or the semiconductor support layer comprises a silicon-based layer.

A second aspect of the disclosure provides a method for fabricating a HBT the method comprising: providing a semiconductor support layer; forming at least four wall structures on the support layer, wherein the wall structures are arranged side-by-side; forming a semiconductor collector-material ridge structure on the support layer, wherein the ridge structure is arranged between two adjacent wall structures of the at least four wall structures; forming a semiconductor base-material layer, wherein a first part of the semiconductor base-material layer is formed on a first region of the ridge structure and a second part of the semiconductor base-material layer is formed across the wall structures, wherein the base-material layer is supported by the wall structures; forming a semiconductor emitter-material layer on the first part of the base-material layer; forming a base contact layer on the second part of the base-material layer; forming an emitter contact layer on the emitter-material layer; and forming a collector contact layer on a second region of the ridge structure.

The method of the second aspect provides the HBT of the first aspect. The method of the second aspect can have implementation forms corresponding to the implementation forms of the HBT of the first aspect, i.e., it may comprise steps to fabricate the further structural features provided by these implementation forms of the HBT.

In an implementation of the method, the forming of the ridge structure comprises: forming an odd number of at least three semiconductor collector-material ridge structures on the support layer, wherein each of the at least three ridge structures is arranged between a different pair of adjacent wall structures; selectively removing all the ridge structures except for the ridge structure between the two adjacent wall structures, after forming the base-material layer, the emitter-material layer, and the contact layers.

The ridge structure between the two adjacent wall structures, i.e. the ridge structure which is not removed, may be the central ridge structure, i.e. the ridge structure which is arranged centrally within all of the ridge structures. The formation of the different layers and ridge structures may be implemented by growth or deposition, particularly by epi-taxial growth. For example, Metalorganic Vapor Phase Epitaxy (MOVPE), Metalorganic Chemical Vapor Deposition (MOCVD) or Molecular Beam Epitaxy (MBE) may be employed.

The method of the first aspect is able to fabricate an improved HBT. In particular, since the collector-material ridge structures—other than the ridge structure between the two adjacent wall structures—are removed by the method, the parasitic base-collector (depletion) capacitance ($C_{cb}$) is significantly reduced in the resulting HBT. The HBT has accordingly extremely low $C_{cb}$, or possibly even zero $C_{cb}$. Accordingly, the cut-off frequencies for both the maximum current gain ($F_t$) and the power gain ($F_{max}$) are improved for the HBT.

In an implementation of the method, the forming of each ridge structure is confined in and guided by a trench formed in the support layer.

In an implementation, the method further comprises forming each ridge structure in a V-groove, wherein the V-groove is disposed in the support layer.

The support layer trench and/or V-groove are characteristic for the NRE technology. Defects can be trapped in a lower part of the ridge structures, and the parts of the ridge structures above can be made more or less defect-free.

In an implementation of the method, extending the base-material layer comprises: epitaxially growing base-material on the ridge structures other than the determined ridge structure, until the base-material merges together over the wall structures and with the base-material layer formed on the determined ridge structure.

This provides an efficient way to extend the base-material layer.

In an implementation of the method, removing the ridge structures comprises: selectively etching the semiconductor collector-material using wet chemistry.

Thus, the material responsible for the parasitic $C_{cb}$ can be easily but efficiently removed.

In an implementation, the method further comprises, before extending epitaxially the base-material layer: forming an etch-stop layer, in particular a not-intentionally-doped III-V semiconductor etch-stop layer, on each ridge structure other than the determined ridge structure.

In an implementation, the method further comprises, after removing the ridge structures: removing the etch-stop layers by selectively etching using wet chemistry.

For instance, for forming the etch-stop layer, a thin InGaP re-growth under the extended base-material layer can be performed. The etch-stop layer protects the extended base-material layer from getting etched during the above-described collector-material ridge structure removal. In this way, the base-collector junction can be completely removed under the extended base-material layer, and therefore the $C_{cb}$ can be reduced to zero.

In an implementation, the method further comprising, before removing the ridge structures: forming a protective layer on the base-material layer and on the emitter-material layer of the ridge structure, respectively.

This protects the top surface of these layers from the processing that removes the ridge structures, and therefore leads to higher stability and yield.

In an implementation of the method, forming the ridge structures comprises, for each ridge structure: forming a narrower ridge portion to confine all defects on the support layer, and forming a wider defect-free ridge portion on top of the narrower ridge portion, wherein the forming of the wider ridge portion is guided by the corresponding two adjacent wall structures.

This improves the performance of the HBT, since the collector-material ridge structure that remains to from the active transistor area is of high quality. The wall structures act as a template to grow the ridge structures, and benefit the stability of the final HBT.

In an implementation of the method, epitaxially forming the ridge structures comprises, for each ridge structure: forming a sub-collector region on the support layer and forming a collector region on the sub-collector region.

In summary, by forming the ridge structure, e.g. by using the NRE approach, the base-material layer can be separately formed around, but outside, the active transistor area. Thus, space is provided to form the base contact layer to contact the base-material layer. This allows reducing the overlap between the base contact layer, the emitter contact layer, and the collector contact layer to reduce contact-induced parasitic capacitances. The template of the wall structures provides the necessary stability to the HBT. Further, the extended base-material can be made independent of the parasitic base-collector junction, which leads to easier scaling control over the base parasitics.

The above and other characteristics and features will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

DETAILED DESCRIPTION

Figure 1:
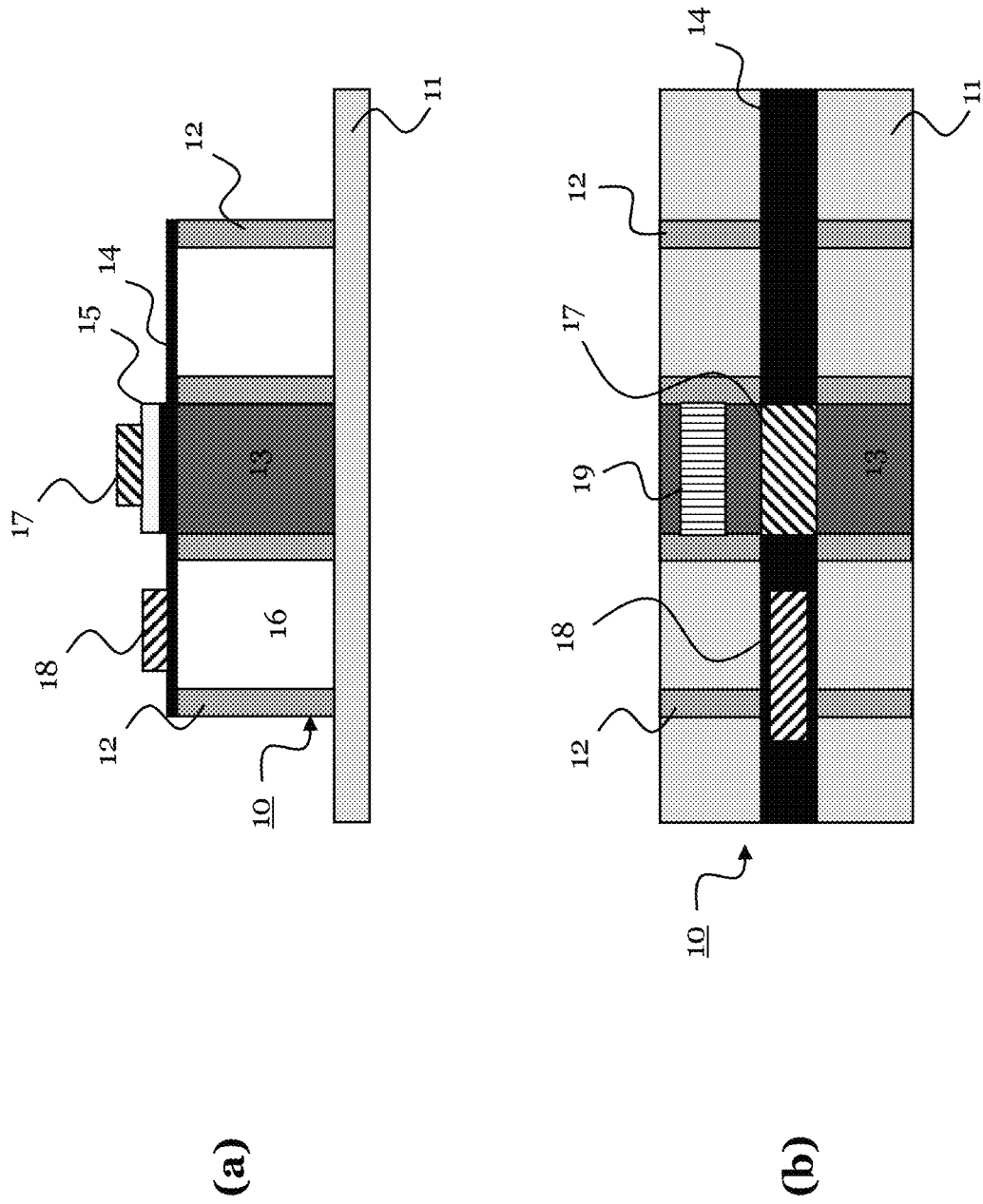
FIG. 1 shows a HBT according to an example embodiment in (a) a cross-sectional view and (b) a top view.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable with their antonyms under appropriate circumstances and that the embodiments described herein are capable of operation in other orientations than described or illustrated herein.

It is to be noticed that the term "comprising", used in the claims, should not be interpreted as being restricted to the features listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising A and B" should not be interpreted as being limited to devices consisting only of components A and B. It means that with respect to the present disclosure, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed subject matter requires more features than are expressly recited in each claim. Rather, as the following claims reflect, various aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, understood methods, structures, and techniques have not been shown in detail in order not to obscure an understanding of this description.

FIG. 1 shows an HBT 10 according to an example embodiment. In particular FIG. 1(*a*) shows a side-view (cross-sectional view) of the HBT 10, and FIG. 1(*b*) shows a top-view of the HBT 10.

It can be seen in FIG. 1 that the HBT 10 comprises a semiconductor support layer 11, and comprises at least four wall structures 12 that are arranged on this support layer 11. The wall structures 12 are arranged side-by-side on the support layer 11, and may be arranged (as exemplarily shown in FIG. 1) parallel to another and/or at a regular interval. Each of the four wall structures 12 may be an elongated wall structure, as shown in FIG. 1(*b*), i.e. its length may extend across the support layer 11.

Further, the HBT 10 comprises a semiconductor collector-material ridge structure 13, which is arranged on the support layer 11. The ridge structure 13 is arranged between two adjacent wall structures 12 of the at least four wall structures 12. These two adjacent wall structures 12 may be (as shown) the central wall structure pair of the at least four wall structures 12. The ridge structure 13 may extend parallel to the adjacent wall structures 12, as shown in FIG. 1(*b*), i.e., its length may extend across the support layer 11. The ridge structure 13 may be a nanoridge, and may be fabricated using the NRE technology.

The HBT 10 further comprises a semiconductor base-material layer 14, which may in its entirety extend over the ridge structure 13 and the wall structures 12. In particular, a first part of the base-material layer 14 is arranged on a first region of the ridge structure 13 and a second part of the base-material layer 14 is arranged across the wall structures 12. Thereby, the base-material layer 14, in particular the second part thereof, is supported by the wall structures 12.

The HBT 10 further comprises a semiconductor emitter-material layer 15, which is arranged on the first part of the base-material layer 14. An active transistor area of the HBT 10 may thus be formed by the first region of the collector-material ridge structure 13, the first part of the base-material layer 14 that is arranged on the first region of the ridge structure 13, and the emitter-material layer 15 that is arranged on the first part of the base-material layer 14.

Notably, no collector-material may be present between the wall structures 12 other than the two adjacent wall structures 12, between which the ridge structure 13 is formed. For instance, spaces 16 may be formed between these other wall structures 12, wherein the spaces 16 may be filled with air.

The spaces 16 may result from removing collector-material, which had been present between these other wall structures 12 before, as will be described below. Instead of such spaces 16, also an insulator material may be present between these wall structures 12 (i.e., the spaces 16 shown in FIG. 1 may be filled with the insulator material). In other words, insulator spacers may be arranged between each pair of the other wall structures 12. Due to the collector-material ridge structure 13, and the fact that there may be no collector-material beneath the second part of the base-material layer 14, the parasitic $C_{cb}$ of the base-collector region can be significantly reduced.

FIG. 1 further shows that the HBT includes a base contact layer 18 that is arranged on the second part of the base-material layer 14, an emitter contact layer 17 that is arranged on the emitter-material layer 15, and a collector contact layer 19 that is arranged on a second region of the ridge structure 13. As exemplarily shown, the base contact layer 18, the emitter contact layer 17, and the collector contact layer 19 may be unconnected (not connected to one another) and/or may be non-overlapping (neither may overlap each of the others). Further, as seen in FIG. 1(b), the base contact layer 18 and at least one of the collector contact layer 19 and the emitter contact layer 17 extend perpendicular to each other (here, exemplarily, both do). This cross-contacting scheme shown in FIG. 1(b) results in reduced contact-induced parasitic capacitances.

A difficulty in controlling the parasitic $C_{cb}$ of the base-collector region in the HBT 10 is separating the formation (e.g. the growth) and the processing of the base-material with respect to the collector-material. It is beneficial to avoid parasitic collector-material (i.e., collector-material outside the active area of the HBT) and/or to remove such material with a sufficient degree of control, e.g. control over the extent of etching that collector-material. Thereby, the stability of the base-material should not be compromise. In, for example, a conventional HBT that is based on a blanket epitaxial growth and subsequent processing, this is not only difficult to achieve, but in case of an SHBT not a viable solution at all.

Figure 2:
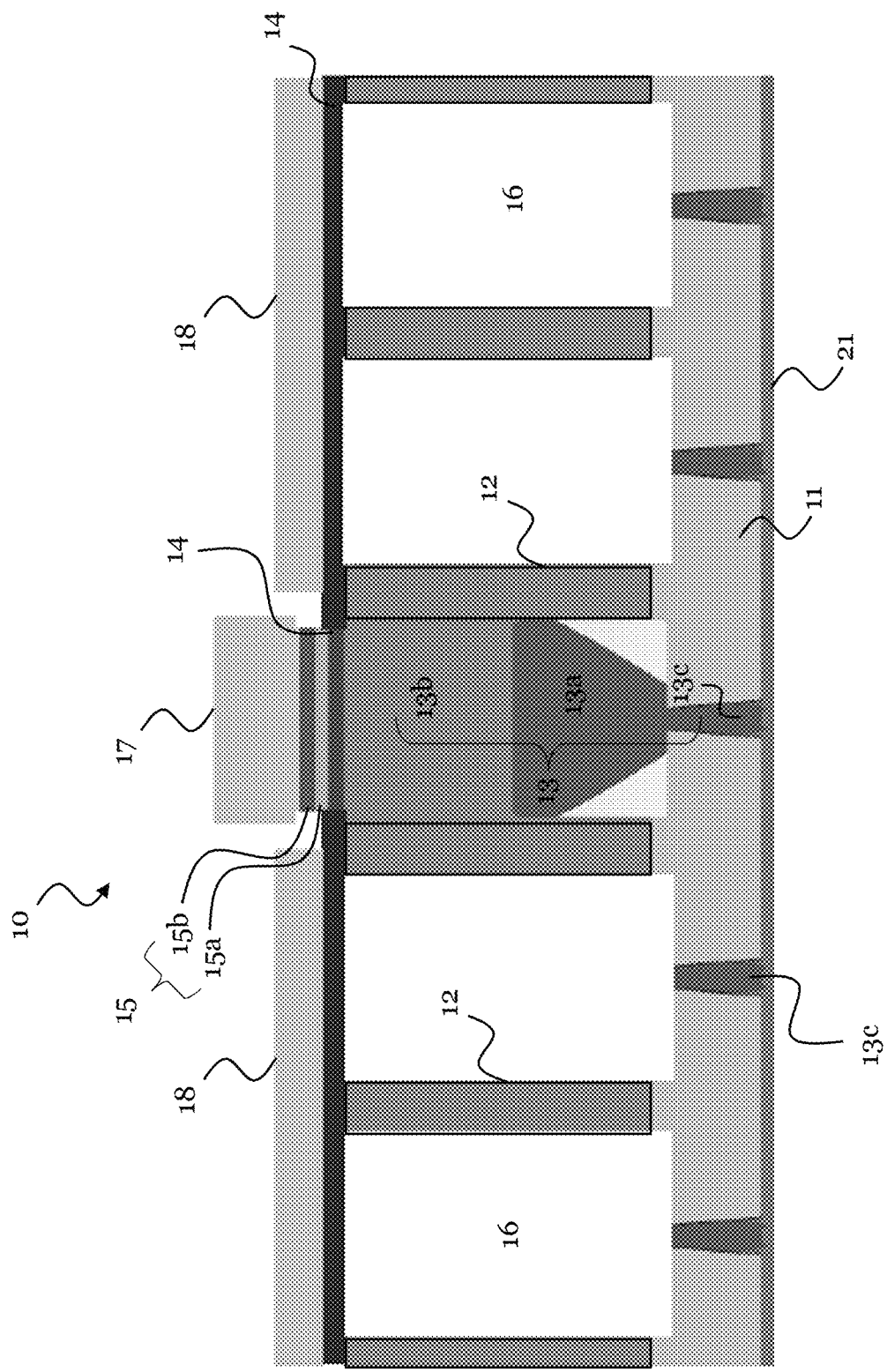
FIG. 2 shows a HBT according to an example embodiment in a cross-sectional view.

According to some example embodiments, the ridge structure 13 may, for example, be formed using an NRE based growth of the collector-material. FIG. 2 shows in this respect a HBT 10 (a cross-sectional view) according to an example embodiment, which bases on the embodiment shown in FIG. 1. Same elements in FIG. 1 and FIG. 2 are labelled with the same reference signs and are implemented likewise.

In FIG. 2, the ridge structure 13 is formed using the NRE approach. Thus, it comprises a narrower ridge portion 13c, which is at least partly within the support layer 11, and functions to trap defects during growth. Further, the ridge structure 13 comprises a wider defect-free ridge portion on top of the narrower ridge portion 13. The wider ridge portion may include a sub-collector region 13a and a collector-region 13b as shown. The formation of the wider ridge portion may be guided by the two adjacent wall structures 12, between which the ridge structure 13 is arranged. That is, the wider ridge portion may be sandwiched by the two adjacent wall structures 12.

FIG. 2 shows that the HBT 10 results from a fabrication method, wherein at the same time of growing the shown ridge structure 13, additional ridges structures have been formed (e.g. one ridge structure 13 may be formed between each adjacent pair of wall structures 12) using the NRE approach. That is, the NRE approach has been used to grow multiple ridge structures 13 simultaneously. Accordingly, additional narrower ridge portions 13c are shown next to (here exemplarily on both sides of) the ridge portion 13c of the shown ridge structure 13. These additional narrower ridge portions 13c are also at least partly arranged in the support layer 11.

In this way, the above-mentioned difficulty may be overcome, due to the separation of each ridge structure 13 by at least one wall structure 12 (i.e., the wall structures 12 function as a template barrier). As a result, the ridge structure 13 shown in FIG. 1 can be used for the active transistor area, while the other ridge structures 13 can be separately processed (and in the end can be sacrificed, i.e. removed, to remove the parasitic collector-material). This separation allows obtaining the HBT shown in FIG. 2 with zero parasitic $C_{cb}$, namely allows removing all the collector-material from the other ridge structures 13 surrounding the ridge structure 13 used for the active transistor area.

Further, in this approach, the base-material layer 14 arranged around the active transistor area (second part of the base-material layer 14) can be created by over-growing all the ridge structures 13 and wall structures 12 to enable a merging of the base-material across the different ridge structures 13. The separation between the base-material and collector-material, to ensure selective removal of only the collector-material, may be further achieved by growing a (very thin) etch-stop layer, particularly from a material known to have a high selectivity towards a solution used to etch.

Notably, in FIG. 2, the emitter-material layer 15 includes an emitter 15a and an emitter cap 15b.

Regarding the HBT 10 shown in FIG. 2, the FIGS. 3-9 show details of a method of fabrication. In particular, a HBT 10 according to an example embodiment, as shown in FIG. 2, can finally be obtained by using the process flow illustrated in the FIGS. 3-9.

Figure 3:
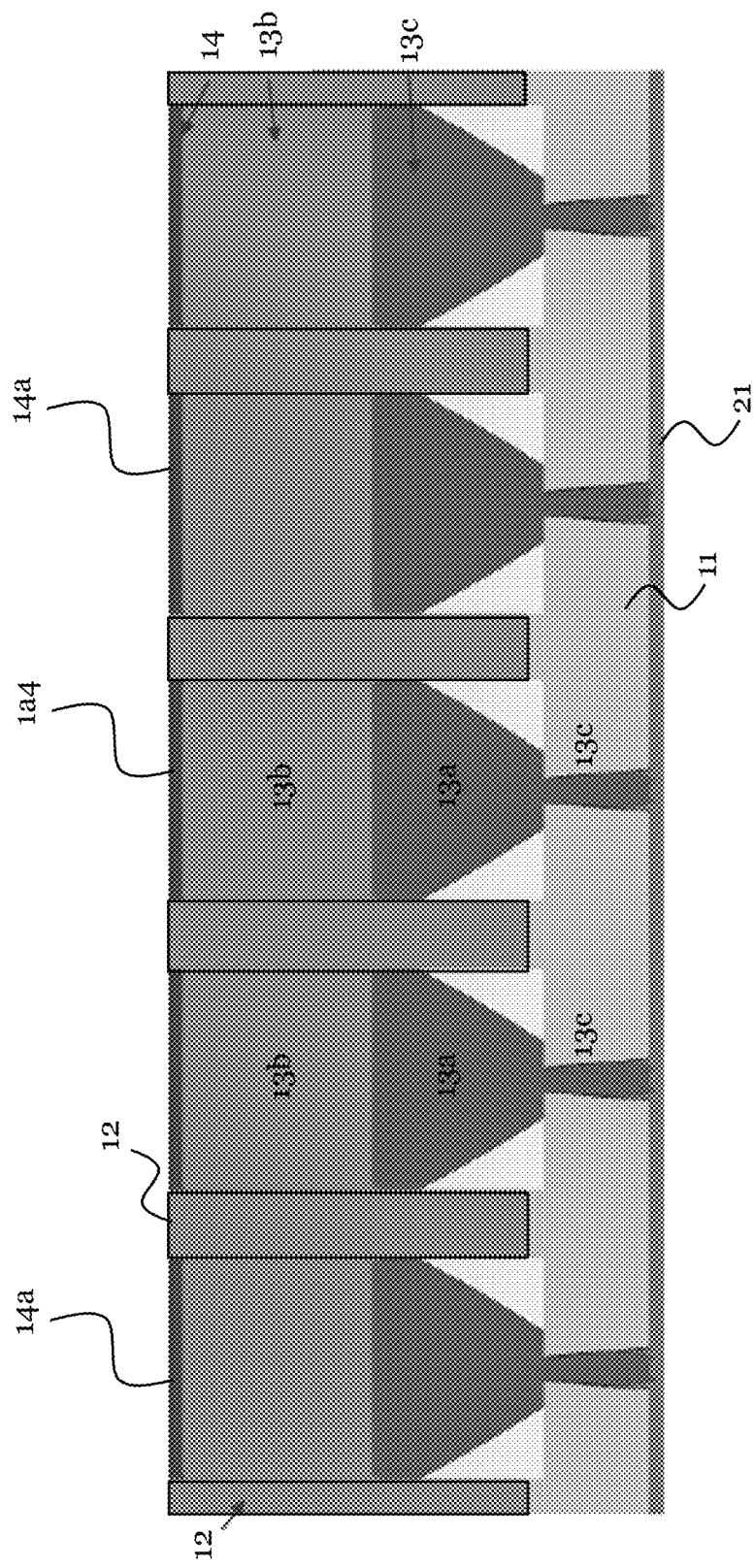
FIG. 3 shows steps of an example method to fabricate a HBT according to an example embodiment.

In FIG. 3, the ridge structures 13 are formed on the support layer 11 and between the respective wall structures 12, which are provided also on the support layer 11. In particular, the ridge structures may be grown epitaxially. In particular, an even number of at least four elongated wall structures 12 may be formed (particularly simultaneously) on the support layer 11. That is, for example, four, six, eight, ten, or more, wall structures 12 may be formed. The wall structures 12 may be arranged side-by-side at a regular interval, i.e., with the same distance between each two adjacent wall structures 12. The wall structures 12 may all extend into the same direction and may thus be arranged in parallel on the support layer 11. The wall structures 12 may each be formed from an oxide, for instance, from silicon dioxide.

Further, an odd number of at least three semiconductor collector-material ridge structures 13 may be formed on the support layer 11. That is, for example, three, five, seven, nine, or more ridge structures 13 are formed. Each ridge structure 13 is formed between two adjacent wall structures 12, wherein these adjacent wall structures 12 may guide growth of the ridge structure 13. The ridge structures 13 may each include the narrower portion 13c arranged at least partly in the support layer 11, the sub-collector region 13a, and the collector region 13b. The ridge structures 13 may be formed from a semiconductor collector-material. The semiconductor collector-material may comprise a first-conductivity-type III-V semiconductor material, for instance, an n-type semiconductor material. In particular, the narrower ridge portions 13c and the sub-collector regions 13b may be made of an n$^+$-doped semiconductor material, for example, n$^+$-doped gallium arsenide, and the collector regions 13a may be made of an n-doped semiconductor material, for example, n-doped gallium arsenide.

Further, a base-material 14a is provided on top of each ridge structure 13. The base-material layer 14 may comprise a second-conductivity-type III-V semiconductor material, for instance, a p-type semiconductor material. In particular, the base-material 14a may be p-doped gallium arsenide.

Figure 4:
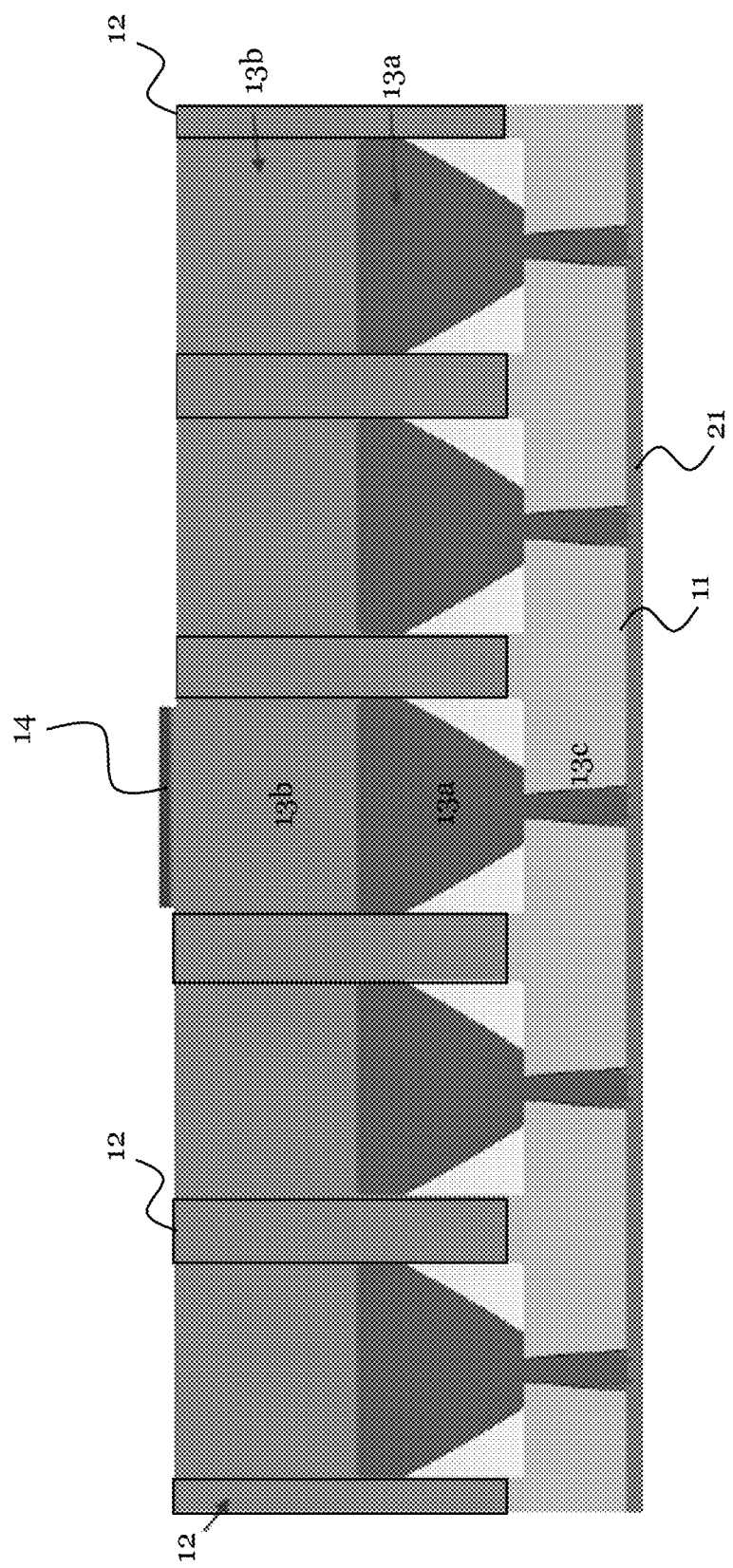
FIG. 4 shows a further step of the example method to fabricate the HBT according to the example embodiment.

FIG. 4 shows that the base-material 14a may be patterned, so as to remain only on one ridge structure 13. That is, the base-material 14a may be removed from each ridge structure 13 except one ridge structure 13. The ridge structure 13 on which the base-material 14a remains is the ridge structure 13 shown in FIG. 2. In particular, in this example, it is the central ridge structure 13. The base-material 14a on the other ridge structures 13 may be removed by etching.

Figure 5:
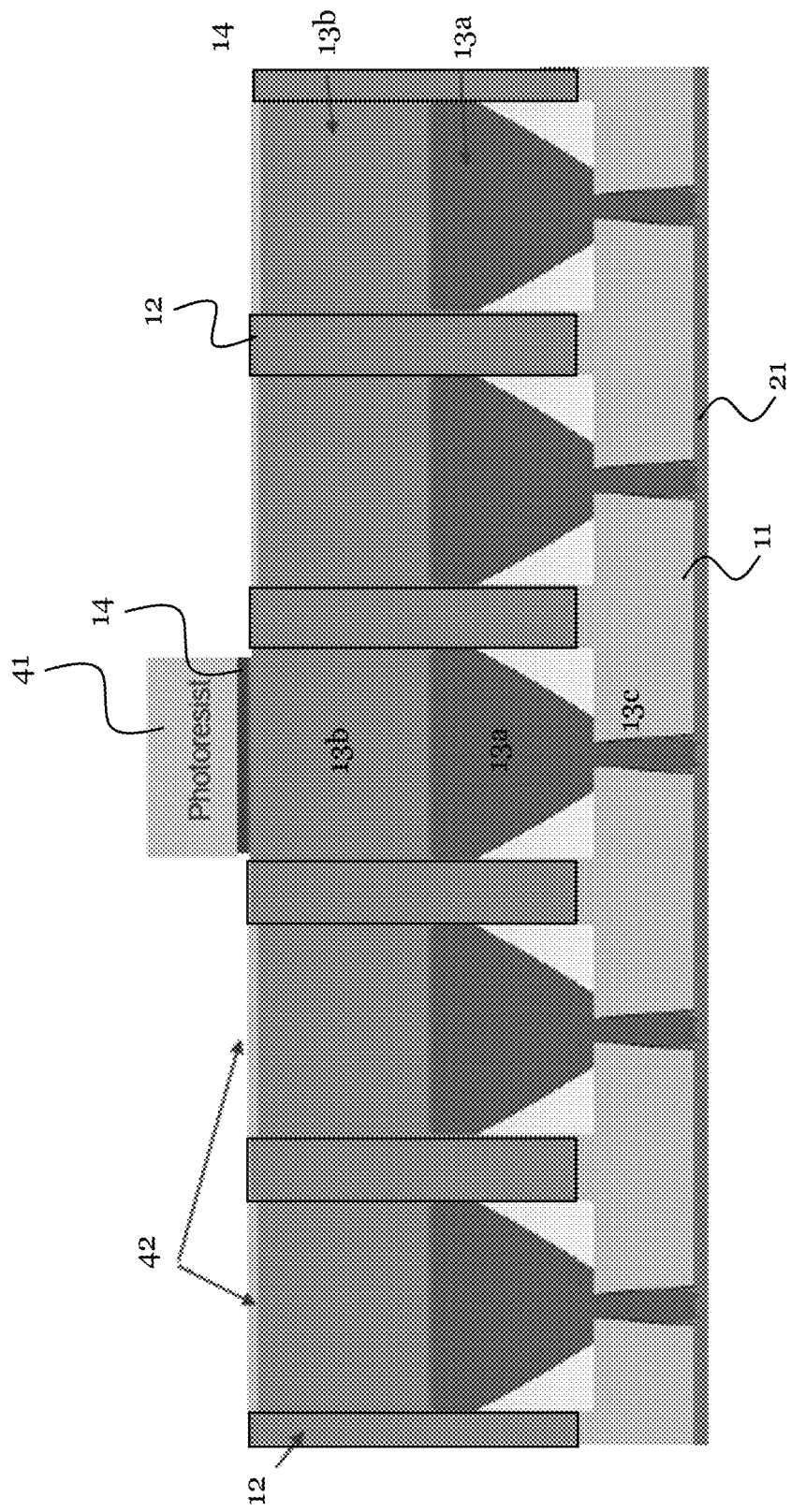
FIG. 5 shows a further step of the example method to fabricate the HBT according to the example embodiment.

FIG. 5 show that then an etch-stop layer 42 may be processed on each ridge structure 13, from which the base-material 14a has been removed in FIG. 4. Such an etch-stop layer 42 is not formed on the ridge structure 13, on which the base-material 14a remains, i.e., the central ridge structure (shown in FIG. 2 to remain in the end). This may be achieved using a photoresist. That is, the etch-stop layers 42 may be formed, particularly grown, on the exposed collector-material surface. The etch-stop layer 42 later enables a selective etching of the collector-material beneath it. The etch-stop layers 42 may be formed from a semiconductor material, in particular, form indium gallium phosphide.

Figure 6:
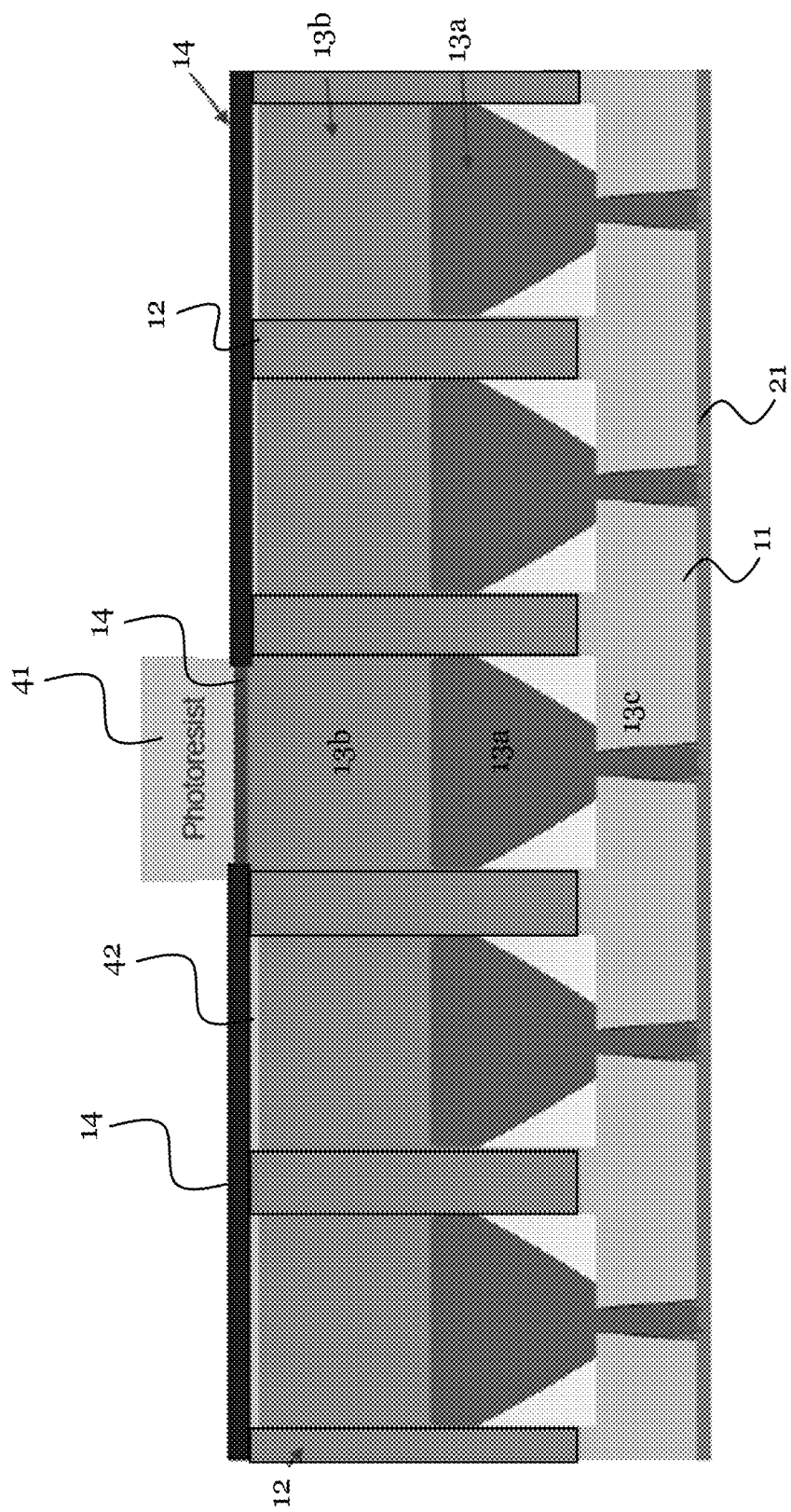
FIG. 6 shows a further step of the example method to fabricate the HBT according to the example embodiment.

FIG. 6 shows that then the base-material layer 14 is formed. In particular, the base-material layer 14 may be formed by epitaxially extending the remaining base-material 14a on the central ridge structure 13, namely by epitaxially growing base-material (e.g., $p^{++}$-doped gallium arsenide) onto the etch-stop layers 42. The additional base-material may specifically be grown until all the base-material merges together over the ridge structures 13 other than the central ridge structure 13, and merges together with the base-material 14a that is formed on the central ridge structure 13c. Thus, the base-material layer 14 is formed.

In particular, a first part of the base-material layer 14 (the remaining base-material 14a) is arranged on the ridge structure 13, and a second part of the base-material layer 14 is arranged across the wall structures 12. The formation of the base-material layer 14 across the wall structures 12 and ridge structures enables later an effective contacting to the base-material layer 14 arranged on the central ridge structure 13. The extended base-material layer 14a finally covers coherently all the wall structures 12 and all the ridge structures 13.

Figure 7:
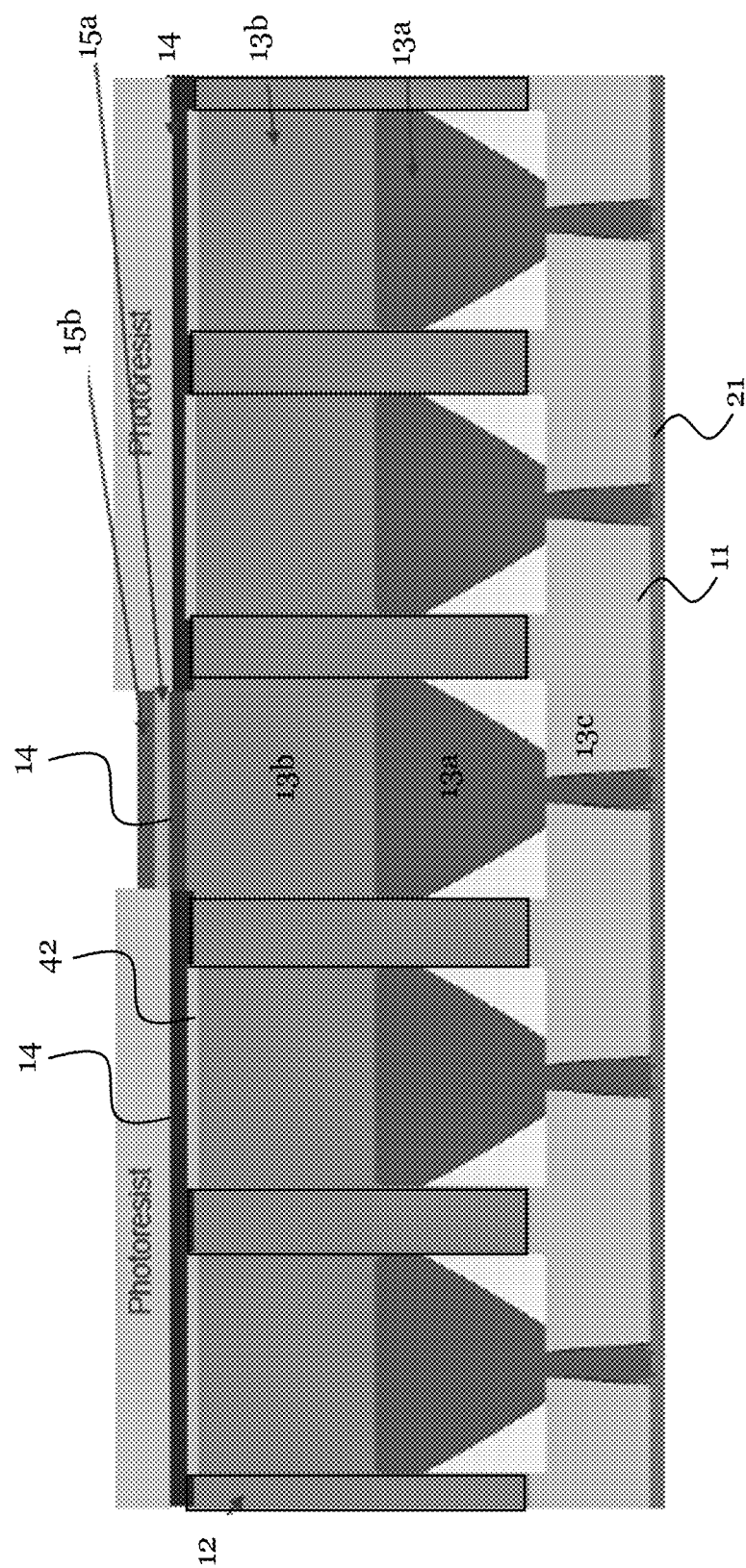
FIG. 7 shows a further step of the example method to fabricate the HBT according to the example embodiment.

FIG. 7 shows that then the emitter-material layer 15 is formed above the central ridge structure 13. In particular, the semiconductor emitter-material layer 15 is arranged on the first part of the base-material layer 14. Thereby, an active transistor area is formed by the collector-material ridge structure 13, the first part of the base-material layer 14 arranged on the ridge structure 13, and the emitter-material layer 15 arranged on the first part of the base-material layer 14. The semiconductor emitter-material may comprise a first-conductivity-type III-V semiconductor material, for instance, an n-type semiconductor material. For example, the emitter-material layer 15 may comprise an n-doped indium gallium phosphide emitter 15a and an $n^{++}$-doped gallium arsenide emitter cap 15b.

The emitter-material layer 15 may be grown using a photoresist as a hard mask to complete the active transistor area. Alternatively, the emitter-material may be provided on top of the extended base-material layer 14 and over all ridge structures 13 and all wall structures 12, respectively, and may then be etched to form the active area. Thereby, a pillar-like structure may be formed above the central ridge structure 13. A spacer layer may further be provided to protect this area from further processing.

Figure 8:
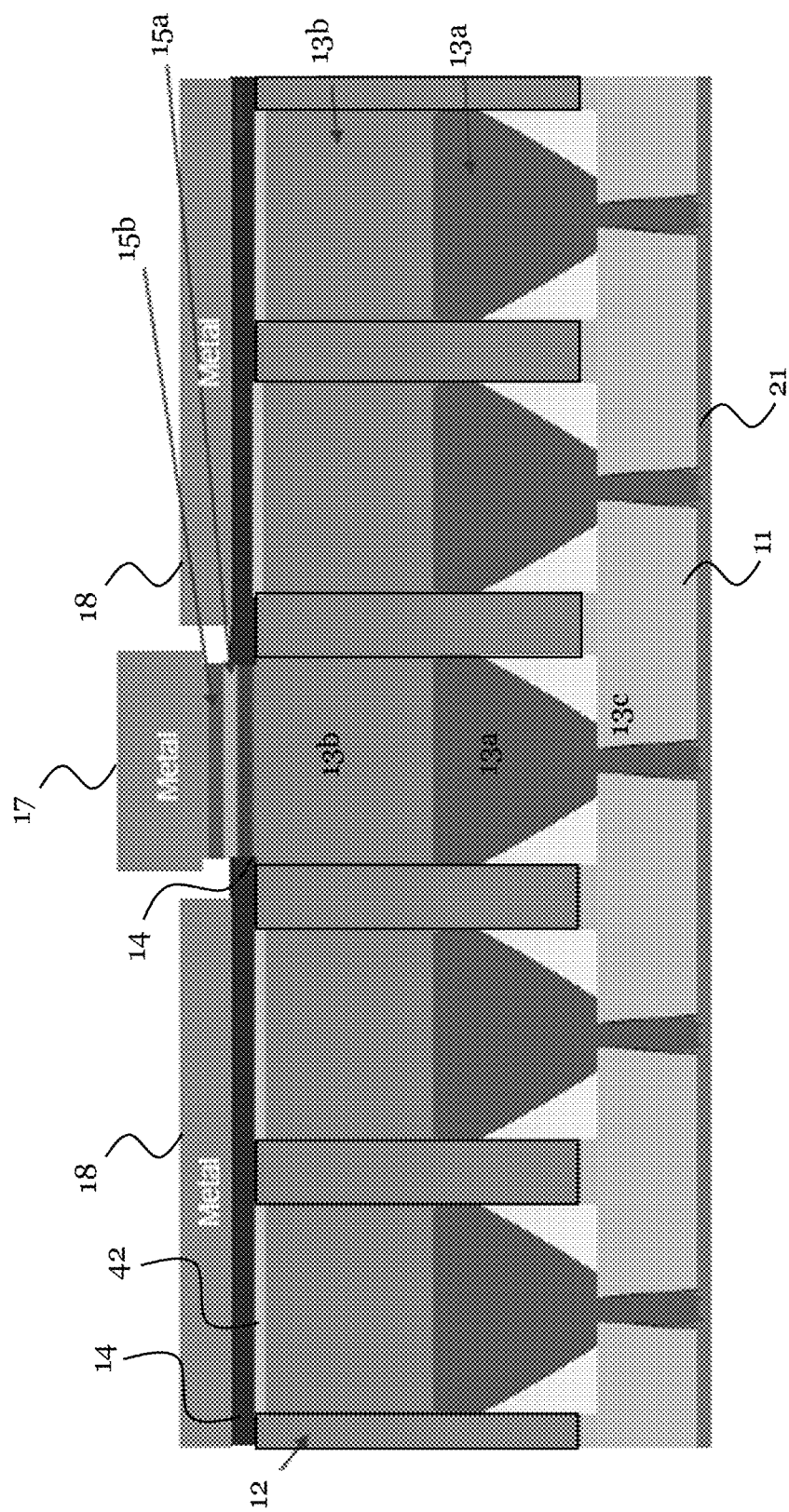
FIG. 8 shows a further step of the example method to fabricate the HBT according to the example embodiment.

FIG. 8 shows further that the base contact layer 18 may be formed on arranged on the second part of the base-material layer 14, and the emitter contact layer 17 may be formed on the emitter-material layer 15. At the same time (not shown in FIG. 8), the collector contact layer 19 may be formed on the second region of the ridge structure 13. The contact layers may be formed from a metal, in particular, by a FEOL metallization process.

Figure 9:
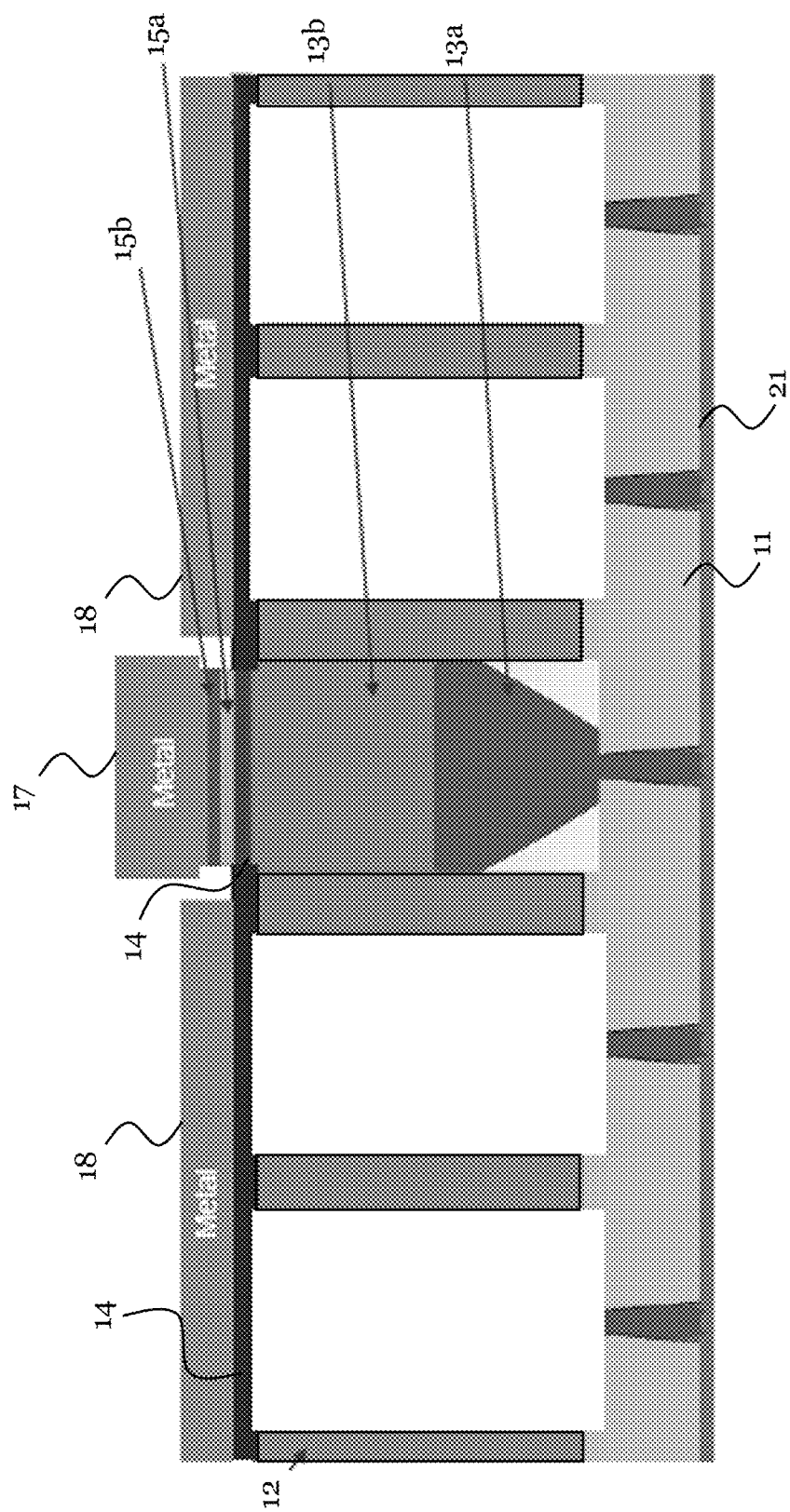
FIG. 9 shows a further step of the example method to fabricate the HBT according to the example embodiment.

FIG. 9 shows that the all the ridge structures 13 except for the ridge structure 13 between the two adjacent wall structures 12, i.e. the central ridge structure 13, are selectively removed. In particular, the collector-region 13a and sub-collector region 13b of these ridge structures 13 may be removed, whereas the narrower ridge portions 13c may remain in the support layer 11. The removal may be done by selectively etching the semiconductor collector-material using wet chemistry. The etching may be stopped by the etch-stop layers 42. The etch-stop layers 42 may then be removed, for example, again by (a different) wet etching.

Figure 10:
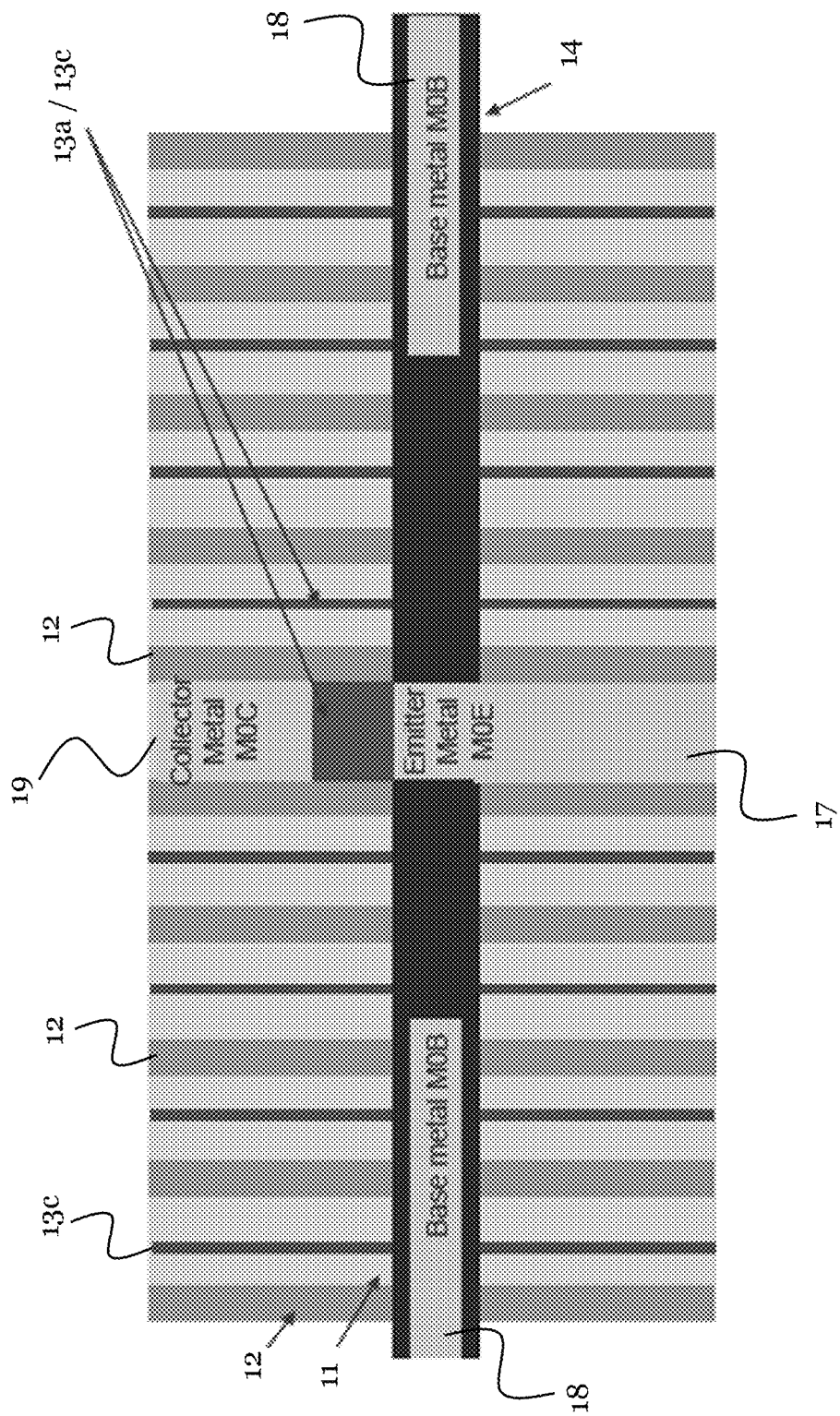
FIG. 10 shows a first contacting scheme of a HBT according to an example embodiment.
Figure 11:
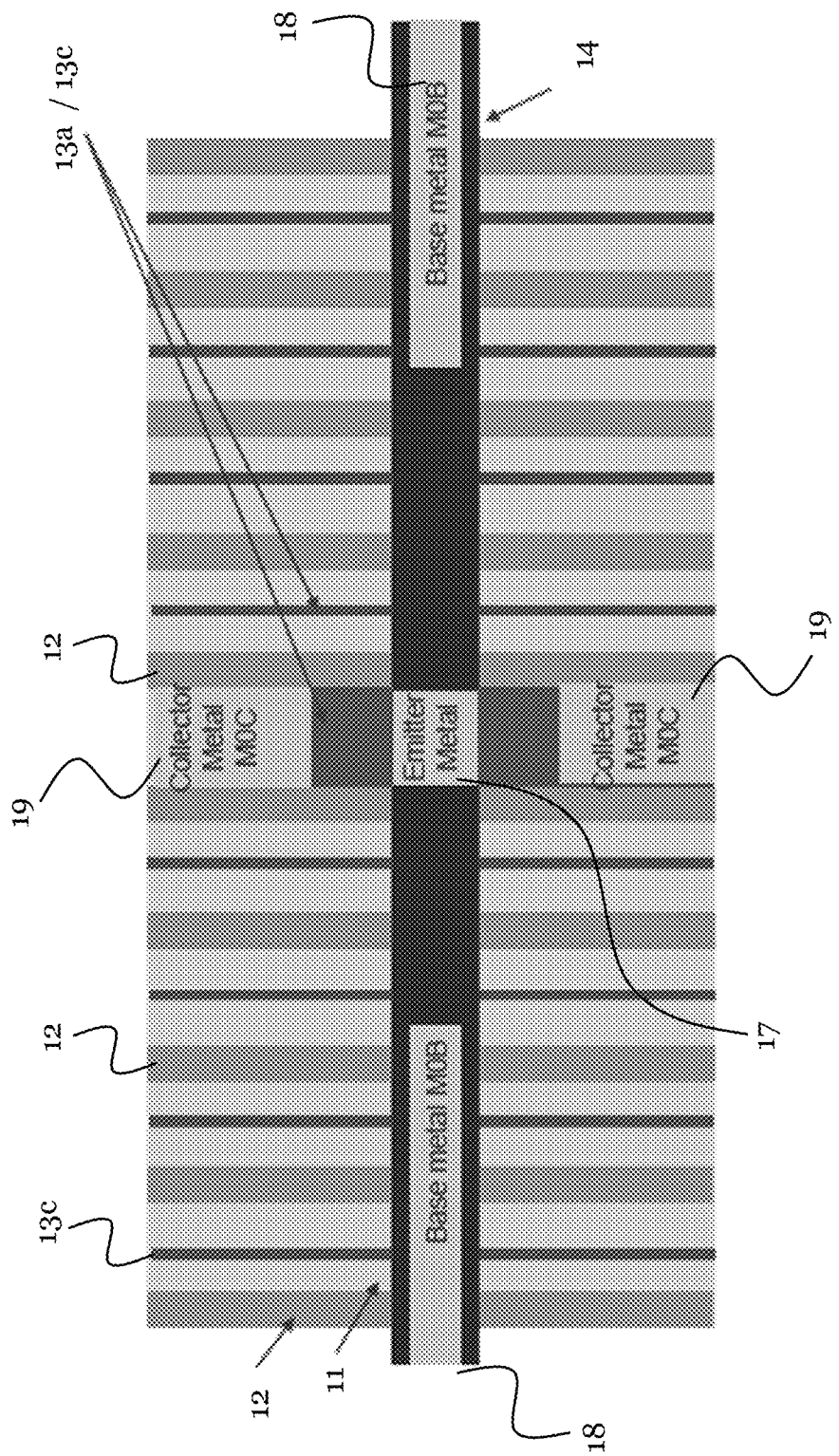
FIG. 11 shows a second contacting scheme of a HBT according to an example embodiment.

FIG. 10 and FIG. 11 show the HBT 10 of FIG. 2, which may be fabricated according to the steps shown in FIGS. 3-9 in a top view. In particular, the cross-contacting scheme can be observed in this view, i.e., the arrangement of the base contact layer 18, the emitter contact layer 17, and the collector contact layer 19. FIG. 10 and FIG. 11 show two alternative arrangements of these contact layers.

In the first alternative shown in FIG. 10, the emitter contact layer 17 is arranged above the first region of the ridge structure 13 and additionally extends along the ridge structure 13.

In the second alternative shown in FIG. 11, the emitter contact layer 17 is arranged only above the first region of the ridge structure 13 on the emitter-material layer 15. Further, two separate collector material contact layers 19 are arranged on the ridge structure 13 on the collector-material. Thereby, each collector material contact layer 19 extends along the ridge structure 13 (which may extend parallel to the wall structures 12 and orthogonal to the base-material layer 14). Additionally or alternatively, the emitter contact layer 17 is arranged between the two base material contact layers 18 (in the top view of the HBT 10).

In both alternatives it is shown that two separate base material contact layers 18 may be arranged on the base-material layer 14. Thereby, each base material contact layer 18 may extend along the base-material layer 14. Further, the emitter contact layer 17 may be arranged at least partly between the two base material contact layers 18 (in the top view of the HBT 10).

Figure 12:
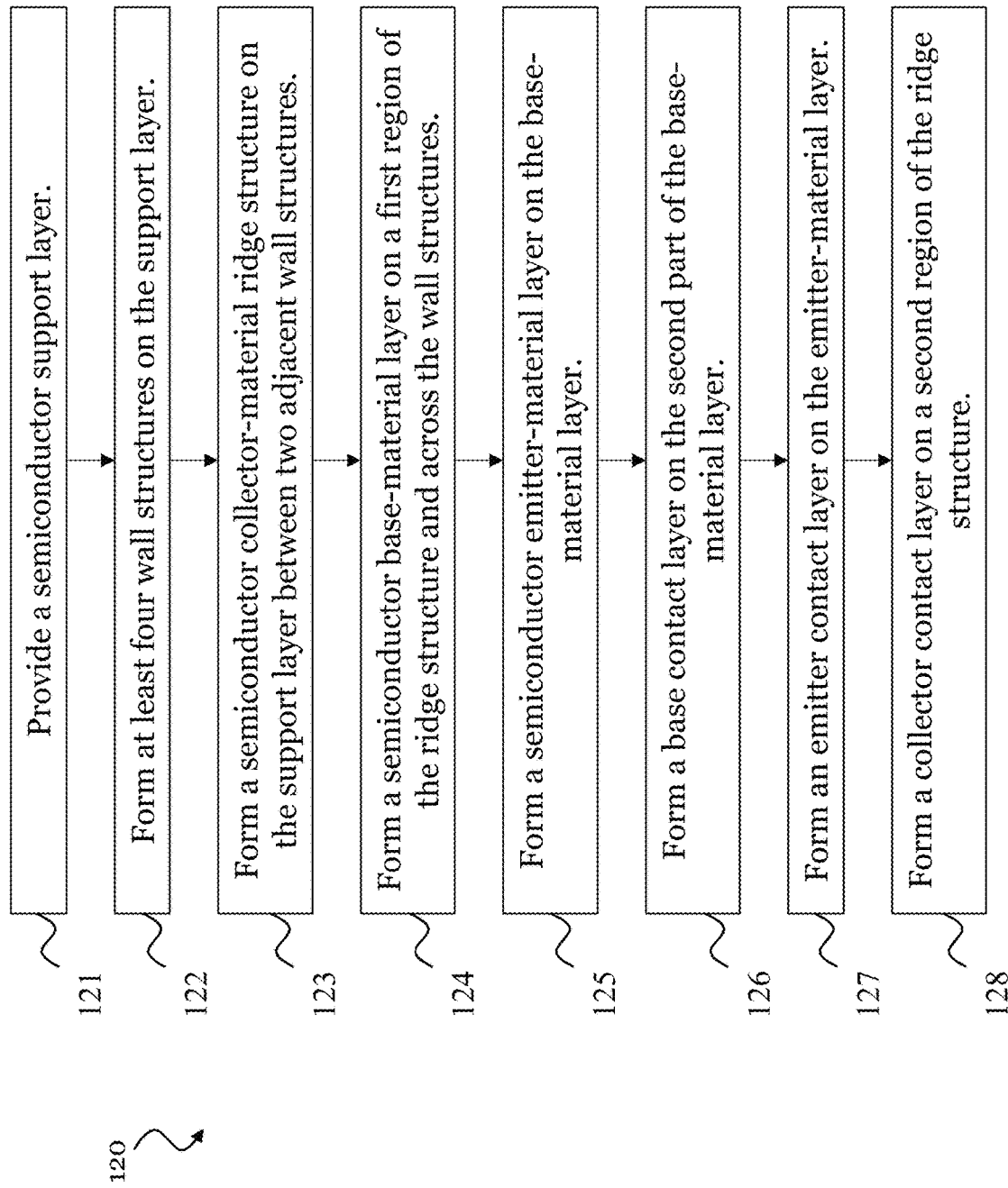
FIG. 12 shows a flow-diagram of a method according to an example embodiment.
Figure 13:
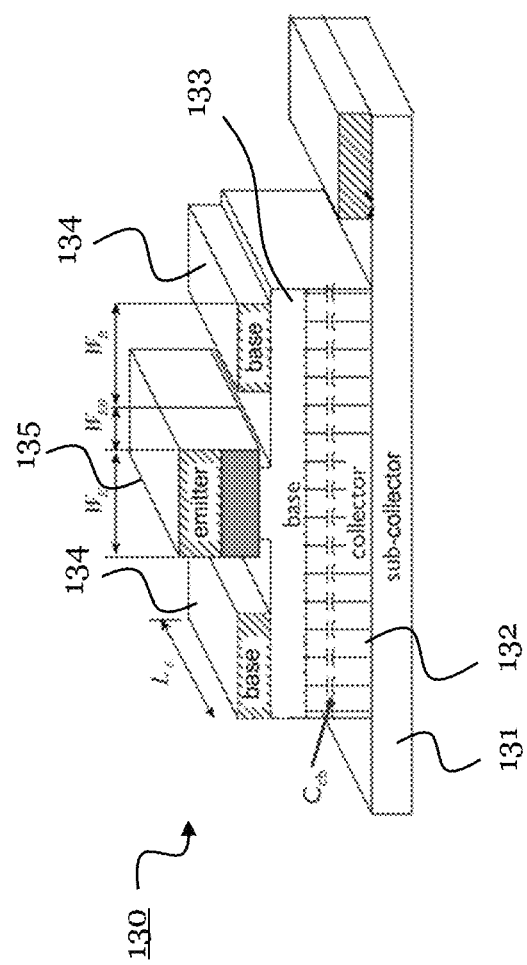
FIG. 13 shows a conventional HBT in a perspective view.
Figure 14:
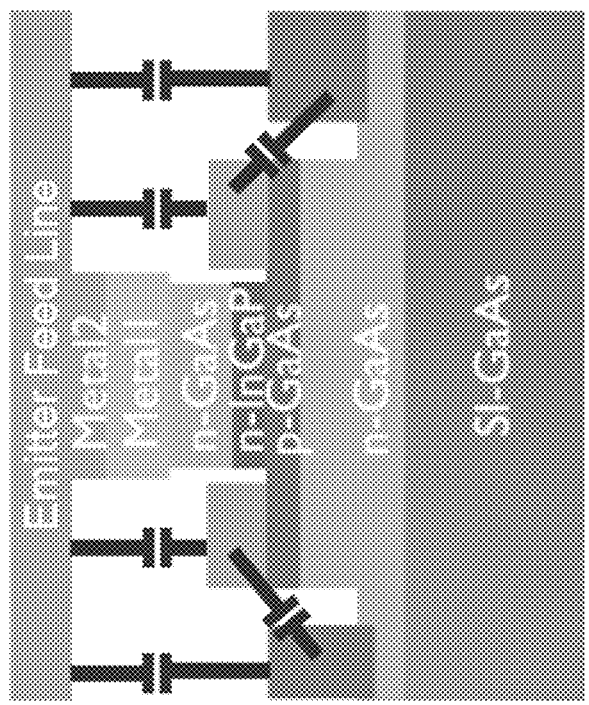
FIG. 14 shows a conventional HBT in a cross-sectional view, which suffers from parasitic capacitance due to contact overlap.

FIG. 12 illustrates schematically a flow-diagram of a general method 120 according to an example embodiment to fabricate a HBT 10 according to an example embodiment. The HBT 10 may be one of the HBTs shown in the previous figures.

The method 120 includes a step 121 of providing the semiconductor support layer 11. Further, the method 120 includes a step 122 of forming the at least four wall structures 12 on the support layer 11, wherein the wall structures 12 are arranged side-by-side. In a step 123, a semiconductor collector-material ridge structure 13 is then formed on the support layer 11, wherein the ridge structure 13 is arranged between two adjacent wall structures 12 of the at least four wall structures 12. The method then includes a step 124 of forming a semiconductor base-material layer 14.

The first part of the semiconductor base-material layer 14 is formed on a first region of the ridge structure 13 and a second part of the semiconductor base-material layer 14 is formed across the wall structures 12, wherein the base-material layer 14 is supported by the wall structures 12. The method 120 further includes a step 125 of forming a semiconductor emitter-material layer 15 on the first part of the base-material layer 14.

The method 120 further includes, for contacting the HBT 10, a step 126 of forming a base contact layer 18 on the second part of the base-material layer 14, a step 127 of forming an emitter contact layer 17 on the emitter-material layer, and a step 128 of forming a collector contact layer 19 on a second region of the ridge structure 13.

The embodiments described herein provide a HBT 10 with reduced parasitic capacitances, in particular, reduced $C_{cb}$ and reduced contact-induced parasitic capacitance. The embodiments are applicable to both a SHBT and Double HBT (DHBT), which may be based particularly on III-V semiconductor materials. De-convoluting the base and collector designs in the HBT 10 opens the possibility of independently improving both. In addition, the embodiments of the present disclosure result in less issues with yield and HBT stability, as is the case with the conventional approaches. Also, the embodiments of the present disclosure remove the requirement for a substrate transfer for fabricating the HBT 10, which further reduces the process complexity and yield issues. Hence, the embodiments of the present disclosure are more suitable for 3D integration of III-V on silicon for RF applications.

It is to be understood that although examples embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A Heterojunction Bipolar Transistor (HBT) comprising:
a semiconductor support layer;
at least four wall structures disposed on the support layer, wherein the wall structures are side-by-side;
a semiconductor collector-material ridge structure disposed on the support layer, wherein the ridge structure is between two adjacent wall structures of the at least four wall structures, and wherein the semiconductor collector-material ridge structure does not extend beneath any of the at least four wall structures, and wherein the HBT does not include any semiconductor collector-material beneath any of the at least four wall structures;
a semiconductor base-material layer, wherein a first part of the base-material layer is disposed on a first region of the ridge structure and a second part of the base-material layer is disposed across the wall structures, wherein the base-material layer is supported by the wall structures;
a semiconductor emitter-material layer disposed on the first part of the base-material layer;
a base contact layer disposed on the second part of the base-material layer;
an emitter contact layer disposed on the emitter-material layer; and
a collector contact layer disposed on a second region of the ridge structure.

2. The HBT of claim 1, wherein:
the base contact layer, the emitter contact layer, and the collector contact layer are unconnected.

3. The HBT of claim 1, wherein:
the base contact layer, the emitter contact layer, and the collector contact layer are non-overlapping.

4. The HBT of claim 1, wherein:
the ridge structure and the base-material layer extend perpendicular to each other in a top view of the HBT.

5. The HBT of claim 1, wherein:
the base contact layer and at least one of the collector contact layer or the emitter contact layer extend perpendicular to each other in a top view of the HBT.

6. The HBT of claim 1, wherein:
the emitter contact layer is disposed only above the first region of the ridge structure.

7. The HBT of claim 6, further comprising:
two separate collector material contact layers disposed on the ridge structure;
wherein at least one of: (i) each collector material contact layer extends along the ridge structure; or (ii) the emitter contact layer is between the two separate collector material contact layers in a top view of the HBT.

8. The HBT of claim 1, wherein:
the emitter contact layer is disposed above the first region of the ridge structure and additionally extends along the ridge structure.

9. The HBT of claim 1, further comprising:
two separate base material contact layers disposed on the base-material layer;
wherein at least one of: (i) each base material contact layer extends along the base-material layer; or (ii) the emitter contact layer is at least partly between the two separate base material contact layers in a top view of the HBT.

10. The HBT of claim 1, wherein:
spaces between the wall structures other than the two adjacent wall structures confining the ridge structure are filled with air or with an insulator material.

11. The HBT of claim 1, further comprising:
an even number of at least four wall structures;
wherein an odd number of at least one wall structure is on either side of the two adjacent wall structures confining the ridge structure.

12. The HBT of claim 1, wherein:
the at least four wall structures are arranged at a regular interval.

13. The HBT of claim 1, wherein:
an active transistor area is formed by the first region of the collector-material ridge structure, the first part of the base-material layer disposed on the first region of the ridge structure, and the emitter-material layer disposed on the first part of the base-material layer.

14. The HBT according to claim 1, wherein:
the semiconductor collector-material and the semiconductor emitter-material comprise a first-conductivity-type III-V semiconductor material; and
the base-material comprises a second-conductivity-type III-V semiconductor material.

15. The HBT of claim 1, wherein the base contact layer is not disposed between the emitter contact layer and the collector contact layer.

16. A method for fabricating a Heterojunction Bipolar Transistor (HBT) the method comprising:
- providing a semiconductor support layer;
- forming at least four wall structures on the support layer, wherein the wall structures are side-by-side;
- growing a semiconductor collector-material ridge structure on the support layer between two adjacent wall structures of the at least four wall structures such that the semiconductor collector-material ridge structure does not extend beneath any of the at least four wall structures;
- forming a semiconductor base-material layer, wherein a first part of the semiconductor base-material layer is formed on a first region of the ridge structure and a second part of the semiconductor base-material layer is formed across the wall structures, wherein the base-material layer is supported by the wall structures;
- forming a semiconductor emitter-material layer on the first part of the base-material layer;
- forming a base contact layer on the second part of the base-material layer;
- forming an emitter contact layer on the emitter-material layer; and
- forming a collector contact layer on a second region of the ridge structure.

17. The method of claim 16, wherein the forming of the ridge structure comprises:
- forming an odd number of at least three semiconductor collector-material ridge structures on the support layer, wherein each of the at least three ridge structures is between a different pair of adjacent wall structures; and
- selectively removing all the ridge structures except for the ridge structure between the two adjacent wall structures, after forming the base-material layer, the emitter-material layer, and the contact layers.

18. The method of claim 16, wherein forming the base contact layer, the emitter contact layer, and the collector contact layer comprises forming the base contact layer, the emitter contact layer, and the collector contact layer such that the base contact layer is not disposed between the emitter contact layer and the collector contact layer.

* * * * *